United States Patent
Moridi et al.

(10) Patent No.: US 11,999,107 B2
(45) Date of Patent: Jun. 4, 2024

(54) CONTROLLED MOLTEN METAL DEPOSITION

(71) Applicant: Cornell University, Ithaca, NY (US)

(72) Inventors: Atieh Moridi, Ithaca, NY (US); Kaushalendra K. Singh, Ithaca, NY (US)

(73) Assignee: Cornell University, Ithaca, NY (US)

(*) Notice: Subject to any disclaimer, the term of this patent is extended or adjusted under 35 U.S.C. 154(b) by 0 days.

(21) Appl. No.: 18/269,051

(22) PCT Filed: Dec. 23, 2021

(86) PCT No.: PCT/US2021/065122
§ 371 (c)(1),
(2) Date: Jun. 22, 2023

(87) PCT Pub. No.: WO2022/140688
PCT Pub. Date: Jun. 30, 2022

(65) Prior Publication Data
US 2023/0398738 A1  Dec. 14, 2023

Related U.S. Application Data

(60) Provisional application No. 63/130,171, filed on Dec. 23, 2020.

(51) Int. Cl.
*B29C 64/273* (2017.01)
*B22F 10/22* (2021.01)
(Continued)

(52) U.S. Cl.
CPC ............ *B29C 64/273* (2017.08); *B22F 10/22* (2021.01); *B22F 10/25* (2021.01); *B22F 12/43* (2021.01);
(Continued)

(58) Field of Classification Search
CPC ............................ B29C 64/223; C23C 14/048
See application file for complete search history.

(56) References Cited

U.S. PATENT DOCUMENTS 3,570,380 A * 3/1971 Kamenstein ........... B41J 2/4655
250/316.1
4,752,455 A * 6/1988 Mayer ................. B23K 20/08
219/121.6
(Continued)

FOREIGN PATENT DOCUMENTS

EP   3543371 A1 *  9/2019  ........... B23K 26/082
EP   3659728 A1 *  6/2020  ............. B22F 10/10
(Continued)

OTHER PUBLICATIONS

European Patent Office, Supplementary European Search Report issued Mar. 5, 2024 in related patent application No. EP21912244.7, 7 pages.

*Primary Examiner* — Timothy Kennedy
(74) *Attorney, Agent, or Firm* — Barnes & Thornburg LLP

(57) ABSTRACT

An additive manufacturing system includes an apparatus to facilitate production at the microscale using metal sheet as feedstock. The additive manufacturing system uses energy from a pulsed laser beam for ejection of metallic droplets to consolidate a part in a layer-by-layer manner. The system may include an enclosure, a stage, a substrate, a feedstock advancement device, an optically transparent support, and a controller.

36 Claims, 13 Drawing Sheets

(51) Int. Cl.
  *B22F 10/25* (2021.01)
  *B22F 12/43* (2021.01)
  *B29C 64/223* (2017.01)
  *B29C 64/236* (2017.01)
  *B29C 64/245* (2017.01)
  *B29C 64/321* (2017.01)
  *B29C 64/371* (2017.01)
  *C23C 14/04* (2006.01)
  *B33Y 10/00* (2015.01)
  *B33Y 30/00* (2015.01)
  *B33Y 40/00* (2020.01)

(52) U.S. Cl.
  CPC .......... *B29C 64/223* (2017.08); *B29C 64/236* (2017.08); *B29C 64/245* (2017.08); *B29C 64/321* (2017.08); *B29C 64/371* (2017.08); *C23C 14/048* (2013.01); *B33Y 10/00* (2014.12); *B33Y 30/00* (2014.12); *B33Y 40/00* (2014.12)

(56) References Cited

U.S. PATENT DOCUMENTS

| | | | | |
|---|---|---|---|---|
| 4,801,352 | A * | 1/1989 | Piwczyk | G03F 7/70216 219/121.84 |
| 4,895,735 | A * | 1/1990 | Cook | C23C 14/048 257/E21.333 |
| 4,987,006 | A * | 1/1991 | Williams | H05K 3/046 427/98.5 |
| 5,171,650 | A * | 12/1992 | Ellis | G03F 3/108 430/278.1 |
| 6,025,110 | A * | 2/2000 | Nowak | C23C 14/0005 430/269 |
| 6,159,832 | A * | 12/2000 | Mayer | H01L 21/2855 438/584 |
| 6,440,503 | B1 * | 8/2002 | Merdan | C23C 14/28 219/121.81 |
| 6,583,381 | B1 * | 6/2003 | Duignan | B23K 15/002 219/121.72 |
| 6,792,326 | B1 * | 9/2004 | Duignan | B23K 26/043 430/11 |
| 8,025,542 | B2 * | 9/2011 | Birrell | B23K 26/048 445/24 |
| 8,728,589 | B2 * | 5/2014 | Auyeung | C23C 14/28 427/595 |
| 9,616,524 | B2 * | 4/2017 | Matusovsky | H05K 3/207 |
| 9,925,797 | B2 * | 3/2018 | Kotler | C23C 14/28 |
| 10,144,034 | B2 * | 12/2018 | Zenou | B05D 3/06 |
| 10,193,004 | B2 * | 1/2019 | Zenou | C23C 14/28 |
| 10,471,538 | B2 * | 11/2019 | Zenou | B23K 26/57 |
| 10,629,442 | B2 * | 4/2020 | Zenou | B41M 5/025 |
| 10,633,758 | B2 * | 4/2020 | Kotler | C23C 14/30 |
| 10,658,283 | B2 * | 5/2020 | Degeilh | H01L 23/49855 |
| 10,688,692 | B2 * | 6/2020 | Zenou | B29C 33/38 |
| 10,799,984 | B2 * | 10/2020 | Zenou | B23K 26/146 |
| 10,828,724 | B2 | 11/2020 | Mamrak et al. | |
| 10,857,732 | B2 * | 12/2020 | Sandstrom | C23C 14/048 |
| 10,899,154 | B2 * | 1/2021 | Krumbholz | G01L 1/2287 |
| 10,940,687 | B2 * | 3/2021 | Batt | B33Y 30/00 |
| 11,097,465 | B2 * | 8/2021 | Zenou | B29C 64/112 |
| 11,207,830 | B2 * | 12/2021 | Gilan | B29C 64/112 |
| 11,446,750 | B2 * | 9/2022 | Zenou | B05C 5/027 |
| 11,497,124 | B2 * | 11/2022 | Zenou | H05K 3/282 |
| 11,691,332 | B2 * | 7/2023 | Zenou | B29C 64/35 264/482 |
| 11,697,166 | B2 * | 7/2023 | Zenou | B05D 3/06 118/200 |
| 11,740,453 | B2 * | 8/2023 | Suhara | G01B 11/24 359/285 |
| 11,752,575 | B2 * | 9/2023 | Zenou | B23K 26/1476 219/76.1 |
| 11,801,704 | B2 * | 10/2023 | Goodfriend | C23C 14/048 |
| 2008/0139075 | A1 * | 6/2008 | Birrell | B23K 26/351 445/2 |
| 2009/0074987 | A1 * | 3/2009 | Auyeung | H05K 3/046 427/596 |
| 2009/0130427 | A1 * | 5/2009 | Grigoropoulos | B82Y 10/00 428/323 |
| 2011/0097550 | A1 * | 4/2011 | Matusovsky | B23K 26/0821 428/167 |
| 2015/0086705 | A1 * | 3/2015 | Meinders | C23C 14/28 427/256 |
| 2016/0233089 | A1 * | 8/2016 | Zenou | C23C 26/02 |
| 2017/0136694 | A1 * | 5/2017 | Rezai | B33Y 30/00 |
| 2017/0189995 | A1 * | 7/2017 | Zenou | B33Y 10/00 |
| 2017/0210142 | A1 * | 7/2017 | Kotler | C23C 14/28 |
| 2017/0250294 | A1 * | 8/2017 | Zenou | B23K 26/0861 |
| 2017/0365484 | A1 * | 12/2017 | Kotler | H01L 21/3063 |
| 2018/0015502 | A1 * | 1/2018 | Zenou | G02B 6/4206 |
| 2018/0015671 | A1 * | 1/2018 | Sandstrom | C23C 14/56 |
| 2018/0111198 | A1 | 4/2018 | Vitanov et al. | |
| 2018/0171468 | A1 * | 6/2018 | Hendriks | H10K 71/162 |
| 2018/0193948 | A1 * | 7/2018 | Zenou | C23C 14/225 |
| 2018/0323139 | A1 * | 11/2018 | Degeilh | G06K 19/0723 |
| 2019/0143449 | A1 * | 5/2019 | Zenou | B22F 12/53 219/76.1 |
| 2019/0270254 | A1 | 9/2019 | Mark et al. | |
| 2019/0322036 | A1 * | 10/2019 | Zenou | B29C 64/209 |
| 2020/0061656 | A1 | 2/2020 | Shalaby | |
| 2020/0070514 | A1 * | 3/2020 | Batt | B33Y 30/00 |
| 2020/0376596 | A1 * | 12/2020 | Zenou | B22F 12/53 |
| 2021/0237184 | A1 * | 8/2021 | Zenou | B23K 3/0638 |
| 2021/0339462 | A1 * | 11/2021 | Zenou | B33Y 10/00 |
| 2021/0347116 | A1 * | 11/2021 | Gilan | B29C 64/223 |
| 2021/0370702 | A1 * | 12/2021 | Suhara | B29C 64/135 |
| 2021/0385951 | A1 * | 12/2021 | Zenou | H05K 3/0091 |
| 2022/0016707 | A1 * | 1/2022 | John | C04B 35/4885 |
| 2022/0040912 | A1 * | 2/2022 | Zenou | B29C 64/223 |
| 2022/0088854 | A1 * | 3/2022 | Zenou | B29C 64/268 |
| 2022/0194111 | A1 * | 6/2022 | Goodfriend | B81C 99/004 |
| 2022/0379396 | A1 * | 12/2022 | Zenou | H05K 3/1275 |
| 2023/0182200 | A1 * | 6/2023 | Hu | B29C 64/268 164/46 |

FOREIGN PATENT DOCUMENTS

| | | | |
|---|---|---|---|
| EP | 3718681 A1 | 10/2020 | |
| WO | WO-2015056253 A1 * | 4/2015 | .......... B23K 26/08 |
| WO | WO-2016020817 A1 * | 2/2016 | ........ B23K 26/0676 |
| WO | 2019074827 A1 | 4/2019 | |
| WO | WO-2020184525 A1 * | 9/2020 | .......... B22F 10/25 |
| WO | WO-2020194167 A1 * | 10/2020 | .......... B23K 26/361 |

* cited by examiner

CONTROLLED MOLTEN METAL DEPOSITION

CROSS-REFERENCE TO RELATED APPLICATION

This application is a National Stage application of International Application No. PCT/US2021/065122 filed Dec. 23, 2021, which claims priority from U.S. Provisional Patent Application No. 63/130,171 filed Dec. 23, 2020, the entire contents of which are hereby incorporated herein by reference.

BACKGROUND

The present disclosure relates to additive manufacturing ("AM") systems and methods, and, in particular, to additive manufacturing of metals. More particularly, the present disclosure relates to additive manufacturing of metals using metal sheet as feedstock.

Various AM systems and processes are known in the art. Many of the existing technologies have a number of known limitations. This is particularly true of such processes that utilize metal powder as feedstock.

Some metal AM systems do not offer effective solutions for production at the microscale. A minimum feature size or resolution that can be achieved by commercially available selective laser melting (SLM) machines dedicated for manufacturing at the microscale is approximately 30 microns. This resolution is limited by the metal powder size and poor confinement of the heating zone generated by the working laser. This poorly confined heating zone also increases the minimum spacing between features that can be achieved using SLM.

Known processes also have a trade-off between the resolution or minimum feature size of the printed part and the deposition or build rate that can be achieved for metal AM processes. FIG. 1 illustrates this relationship for certain metal AM processes. Approaches such as electrophoretic deposition (ED), electrohydrodynamic (EHD) printing, and direct ink writing (DIW) can provide the resolution necessary for microscale manufacturing (i.e. a feature size less than about 2 microns). However, these processes use metal nanoparticles or powders as feedstock which have a number of limitations. First, the final properties of the parts manufactured by processes using powder feedstocks are directly affected by the size and quality of the powders. High-quality metallic powders are expensive, which increases the raw material costs. Moreover, these powders often form an outer layer of oxygen which results in the printed parts having a higher oxygen content even when produced in a protected environment. The amount of oxygen content, moisture absorption and contamination vary during shipping and storage which can induce inconsistencies in the mechanical properties of the printed parts resulting in poor reproducibility. These powder feedstocks are also flammable. Other processes such as wire-fed directed energy deposition (Wire-DED) can achieve build rates up to 2000 cc/hour, but the resolution is very poor with a minimum feature size of approximately 16000 μm. Moreover, as shown in FIG. 1, these technologies, along with electron beam melting (EBM) and binder jetting, suffer from similar trade-offs in resolution versus build rate. The metal AM systems and methods of the present disclosure allow production of high-resolution parts with closer feature spacing and high deposition rates as compared to the processes discussed above.

SUMMARY

According to the present disclosure, an additive manufacturing system includes an enclosure, a pulsed laser, a feedstock, a feedstock advancement device, and a controller. The enclosure defines an inlet, an exhaust, and an aperture and includes a substrate upon which a workpiece is to be formed and an optically transparent support disposed between the aperture and the substrate. The pulsed laser is disposed outside the enclosure and positioned to emit one or more pulses through the aperture and into the enclosure. The feedstock may be a sheet or ribbon of material, such as metal. The feedstock advancement device is at least partially disposed within the enclosure and is configured to advance the feedstock within the enclosure with respect to the optically transparent support and to maintain the feedstock adjacent the optically transparent support. The controller is configured to cause the pulsed laser to emit one or more pulses through the aperture and the optically transparent support to impinge upon a selected portion of the feedstock to liquefy the selected portion of the feedstock and discharge a droplet of the material from a portion of the feedstock onto the substrate or onto a workpiece on the substrate.

In some embodiments, the pulsed laser is controllable, via the controller, in an X-plane, a Y-plane and/or both the X-Y planes to raster the laser across the feedstock.

In some embodiments, the additive manufacturing system further includes at least one scanning mirror and the pulsed laser is controllable, via the controller and at least one scanning mirror, in an X-plane, a Y-plane and/or both the X-Y planes to raster the laser across the feedstock.

In some embodiments, the inlet is connected to a gas supply line delivering an inert gas, and the exhaust is connected to an external environment to exhaust gas or fumes from the enclosure.

In some embodiments, the sheet or ribbon of material comprises a metal, a metal alloy, a plastic, a polymer, a ceramic, a semiconducting material, or a composite of two or more materials.

In some embodiments, the pulsed laser comprises a nanosecond (ns)-pulsed laser, a femtosecond (fs)-pulsed laser, or a picosecond (ps)-pulsed laser.

In some embodiments, the controller is configured to cause the pulsed laser to emit one or more pulses having a duration that ranges from about 1 ns to about 500 ns, a duration of at most 200 ns, or a duration of about 30 ns.

In some embodiments, the pulsed laser has a power density or laser fluence between about 0.001 and about 100 J/cm2.

In some embodiments, the controller is configured to cause the pulsed laser to emit one or more pulses that impinge upon the feedstock with a power density or laser fluence that ranges from about 0.001 J/cm2 to about 100 J/cm2 or from about 1.4 J/cm2 to about 2.8 J/cm2.

In some embodiments, the controller is configured to cause the pulsed laser to heat a portion of the feedstock to a temperature that ranges from about 0.4 T m to about 0.7 T m for the feedstock material, or to a temperature of about 0.6 T m for the feedstock material.

In some embodiments, the controller is configured to adjust a print resolution of the workpiece on-the-fly between a first activation of the pulsed laser to emit one or more pulses onto a first selected portion of the feedstock and a second activation of the pulsed laser to emit one or more pulses onto a second selected portion of the feedstock.

In some embodiments, the controller is configured to control the pulsed laser to adjust a print resolution of the workpiece on-the-fly by changing at least one of a pulse shape, a pulse duration, a pulse frequency, a pulse power density or laser fluence, a pulse beam size or pulse width, or a number of pulses between the first activation and the second activation.

In some embodiments, the controller is configured to control a spot size of the one or more pulses by offsetting a focal plane of the pulsed laser relative to an upper surface of the feedstock.

In some embodiments, the controller is configured to cause the pulsed laser to emit one or more pulses that impinge upon the feedstock with a laser beam spot size that ranges from about 1 µm to about 1000 µm, about 10 µm to about 30 µm, or a laser beam spot size of about 20 µm.

In some embodiments, the droplet discharged from the portion of the feedstock is deposited onto the substrate or onto the workpiece on the substrate directly underneath the selected portion of the feedstock. In some embodiments, the substrate is movable.

In some embodiments, the system includes a moveable stage disposed within the enclosure and the substrate is positioned on the moveable stage In some embodiments, the feedstock advancement device comprises one or more guide rollers. In some embodiments, the feedstock advancement device comprises a first set of guide rollers on a first side of the optically transparent support and a second set of guide rollers on a second side of the optically transparent support.

In some embodiments, the controller is configured to advance the feedstock, via the feedstock advancement device, following the discharge of the droplet of the material from the portion of the feedstock. In some embodiments, the controller is configured to cause the pulsed laser to emit a plurality of pulses through the aperture and the optically transparent support to impinge upon a corresponding plurality of selected portions of the feedstock to liquefy the selected portions of the feedstock and discharge a corresponding plurality of droplets of the material from corresponding portions of the feedstock, each of the plurality of droplets being deposited onto the substrate or onto a workpiece on the substrate underneath the respective selected portions of the feedstock.

In some embodiments, the controller is configured to advance the feedstock, via the feedstock advancement device, following the discharge of a plurality of droplets of the material from the portion of the feedstock from a plurality of selected portions of the feedstock.

In some embodiments, the droplet of the material is discharged from a bottom portion of the feedstock.

In some embodiments, the thickness of the feedstock ranges from about 0.5 µm to about 100 µm or from about 4 µm to about 8 µm.

In some embodiments, the distance between the feedstock to the substrate ranges from about 100 µm to about 1 m.

In some embodiments, the system further includes means for applying an electric or magnetic field to the droplet as it travels from the feedstock to the substrate.

In some embodiments, the location of the transparent support is fixed within the enclosure.

According to another aspect of the present disclosure, an additive manufacturing method includes positioning a feedstock comprising a sheet or ribbon of material within an enclosure, the enclosure defining an inlet, an outlet, and an aperture and comprising a substrate upon which a workpiece is to be formed and an optically transparent support having a surface over which the feedstock is movable and which is disposed between the aperture and the substrate; and activating a pulsed laser disposed outside the enclosure, via a controller, to emit one or more pulses through the aperture and into the enclosure, through the optically transparent support, and onto a selected portion of the feedstock to liquefy the selected portion of the feedstock and to discharge a droplet of the material from a portion of the feedstock onto the substrate or onto a workpiece on the substrate.

In some embodiments, the method further includes moving the feedstock and/or the pulsed laser relative to each other by moving the feedstock, moving the pulsed laser, or moving both the feedstock and the pulsed laser.

In some embodiments, the method further includes moving the feedstock via a feedstock advancement device at least partially disposed within the enclosure. In some embodiments, the method further includes utilizing the feedstock advancement device to maintain the feedstock adjacent the optically transparent support.

In some embodiments, the method further includes advancing the feedstock via a feedstock advancement device at least partially disposed within the enclosure, the feedstock advancement device maintaining the feedstock in contact with the optically transparent support.

In some embodiments, the method further includes utilizing a controller to tune a characteristic of the pulsed laser, via the controller, prior to the emission of the one or more pulses.

In some embodiments, the characteristic of the pulsed laser comprises a spot size of the one or more pulses incident upon the feedstock material.

In some embodiments, the act of tuning comprises actuating, via the controller, one or more actuators to offset a focal plane of the pulsed laser relative to an upper surface of the feedstock.

In some embodiments, the characteristic of the pulsed laser comprises a pulse shape. In some embodiments, the pulse shape comprises one of a Gaussian, top-hat, annular or Bessel beam profile. In some embodiments, the characteristic of the pulsed laser comprises a pulse duration. In some embodiments, the characteristic of the pulsed laser comprises a pulse frequency. In some embodiments, the characteristic of the pulsed laser comprises a pulse power density. In some embodiments, the characteristic of the pulsed laser comprises a pulse beam size or pulse width.

In some embodiments, the method further includes utilizing a controller to control a laser fluence to influence or to control a speed and/or a size of the droplet discharged from the portion of the feedstock.

In some embodiments, the method further includes utilizing a controller to adjust a print resolution of the workpiece on-the-fly between a first activation of the pulsed laser to emit one or more pulses onto a first selected portion of the feedstock and a second activation of the pulsed laser to emit one or more pulses onto a second selected portion of the feedstock.

In some embodiments, the controller is configured to control a print resolution of the workpiece on-the-fly by adjusting at least one of a pulse shape, a pulse duration, a pulse frequency, a pulse power density or laser fluence, a pulse beam size or pulse width, or a number of pulses between the first activation and the second activation.

In some embodiments, the droplet of the material is discharged from a bottom portion of the feedstock.

Additional features of the present disclosure will become apparent to those skilled in the art upon consideration of illustrative embodiments exemplifying the best mode of carrying out the disclosure as presently perceived.

BRIEF DESCRIPTIONS OF THE DRAWINGS

The detailed description particularly refers to the accompanying figures in which.

Figure 1:
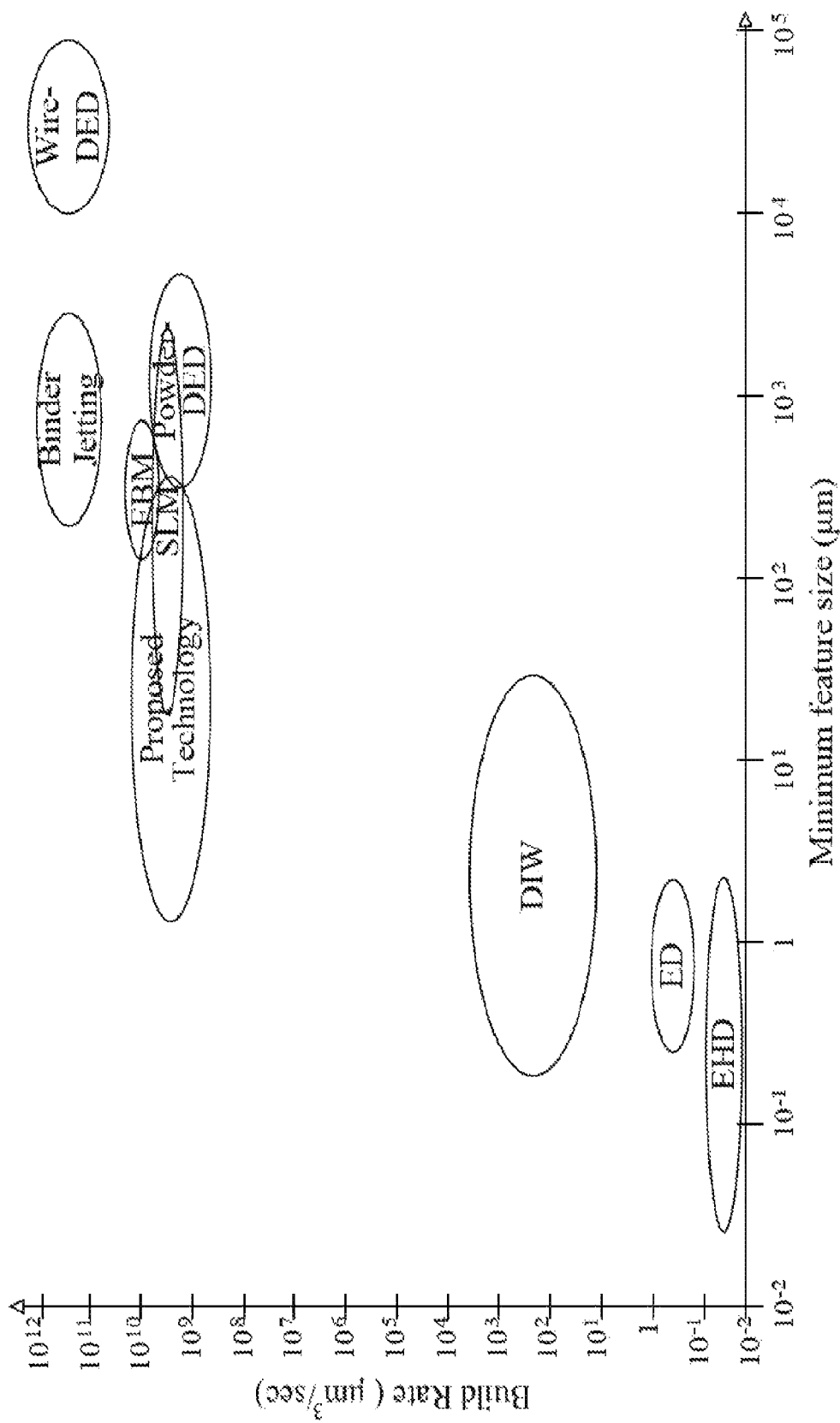
FIG. 1 is a chart showing various additive manufacturing processes relative to one another based on each process's build rate and minimum feature size.
Figure 2:
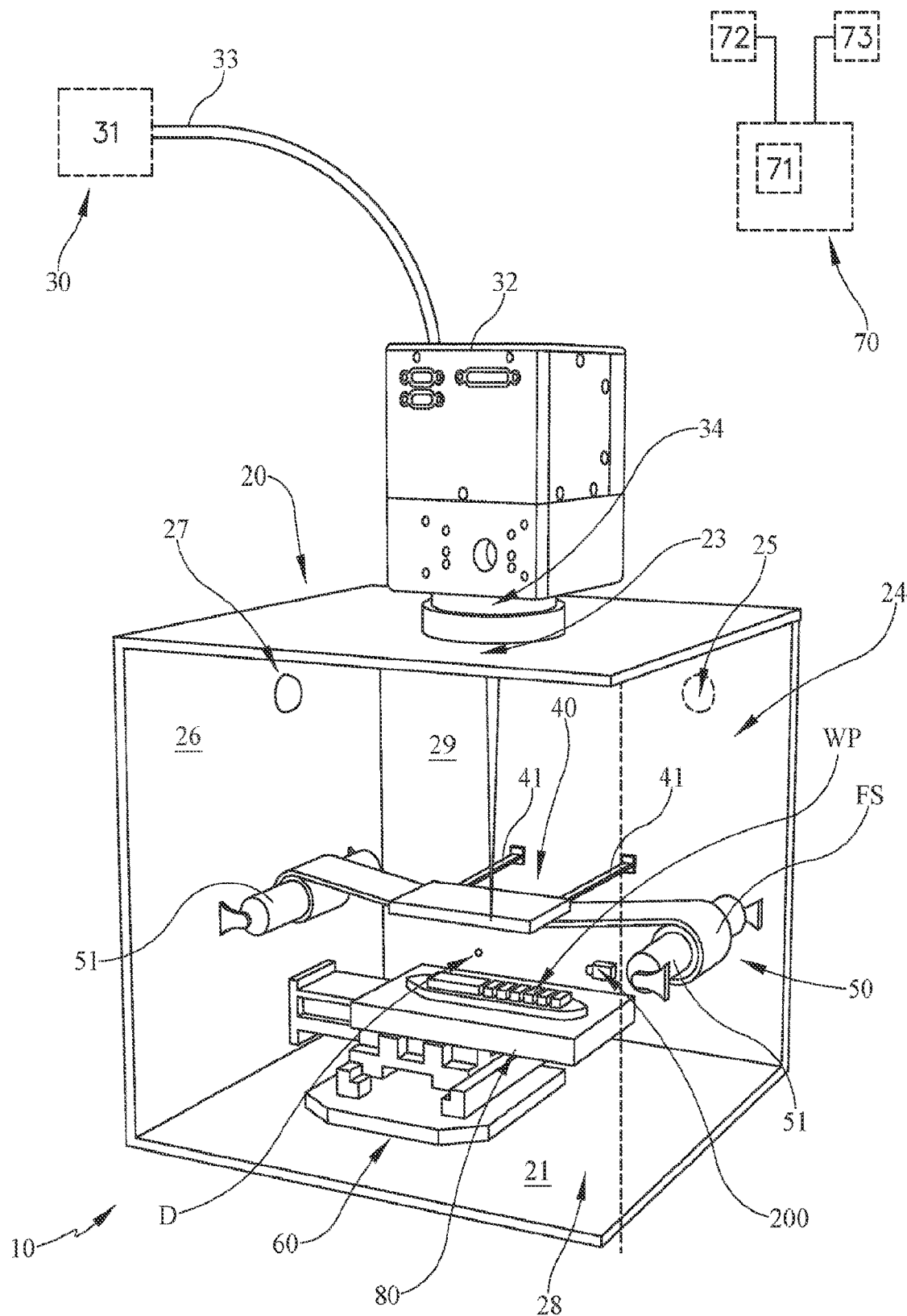
FIG. 2 is a perspective view of an example additive manufacturing system of the present disclosure.
Figure 5:
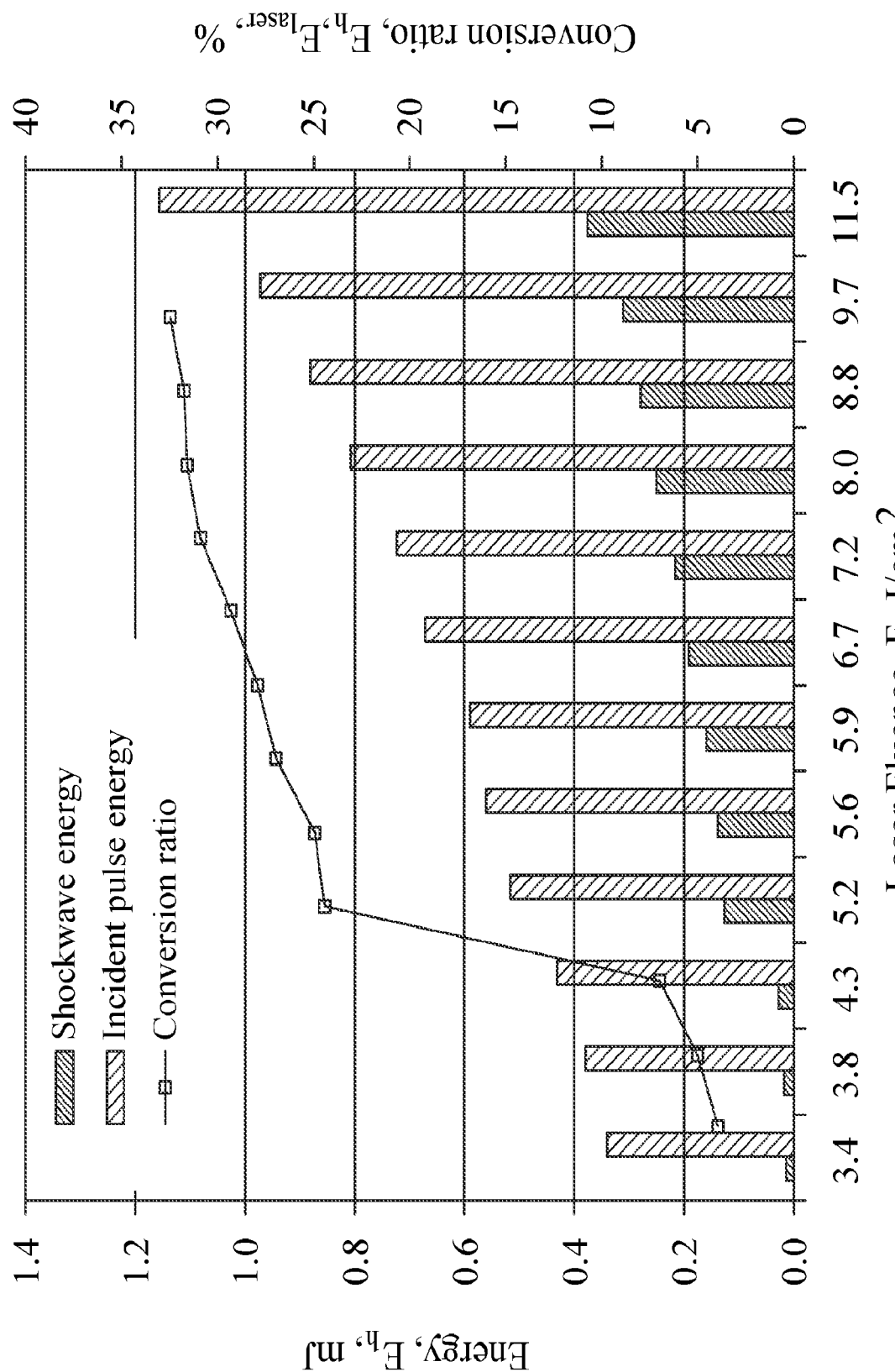
Figure 6:
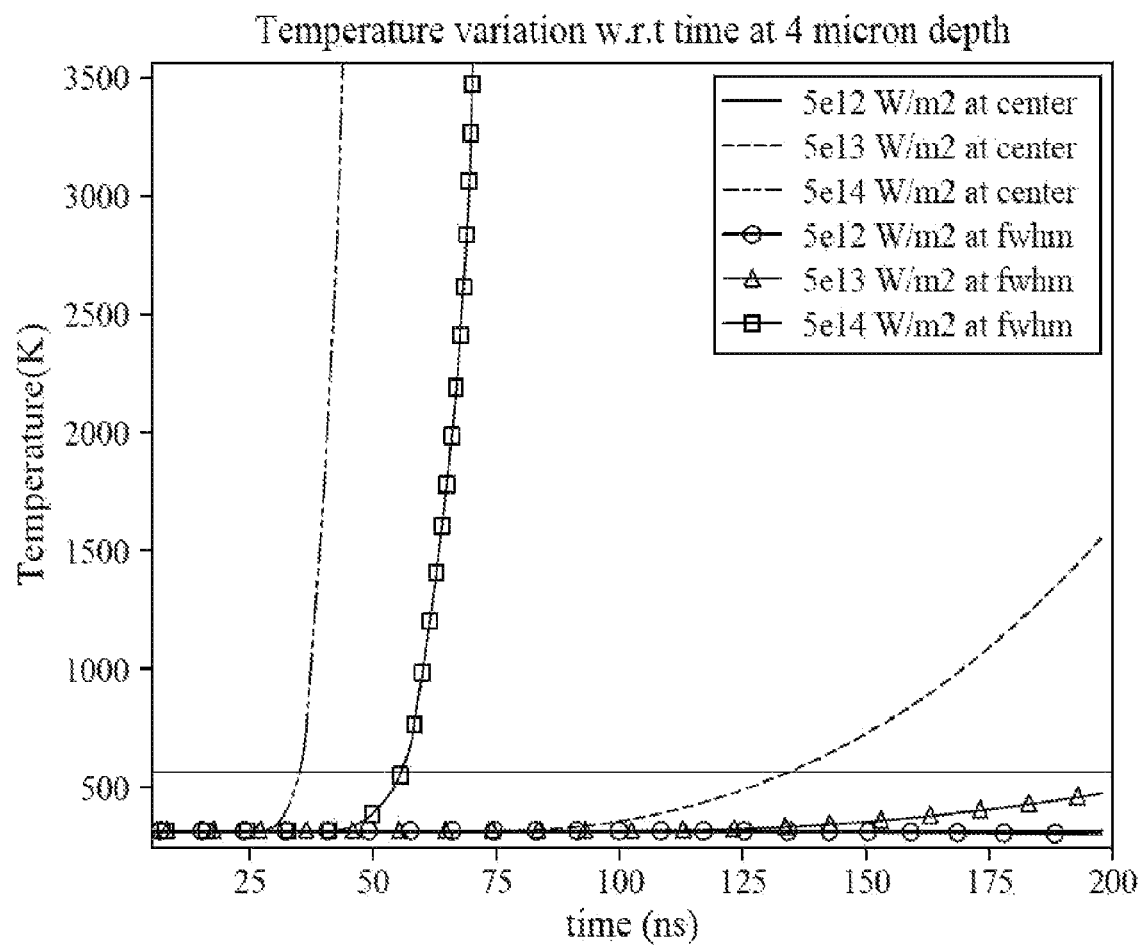
Figure 7:
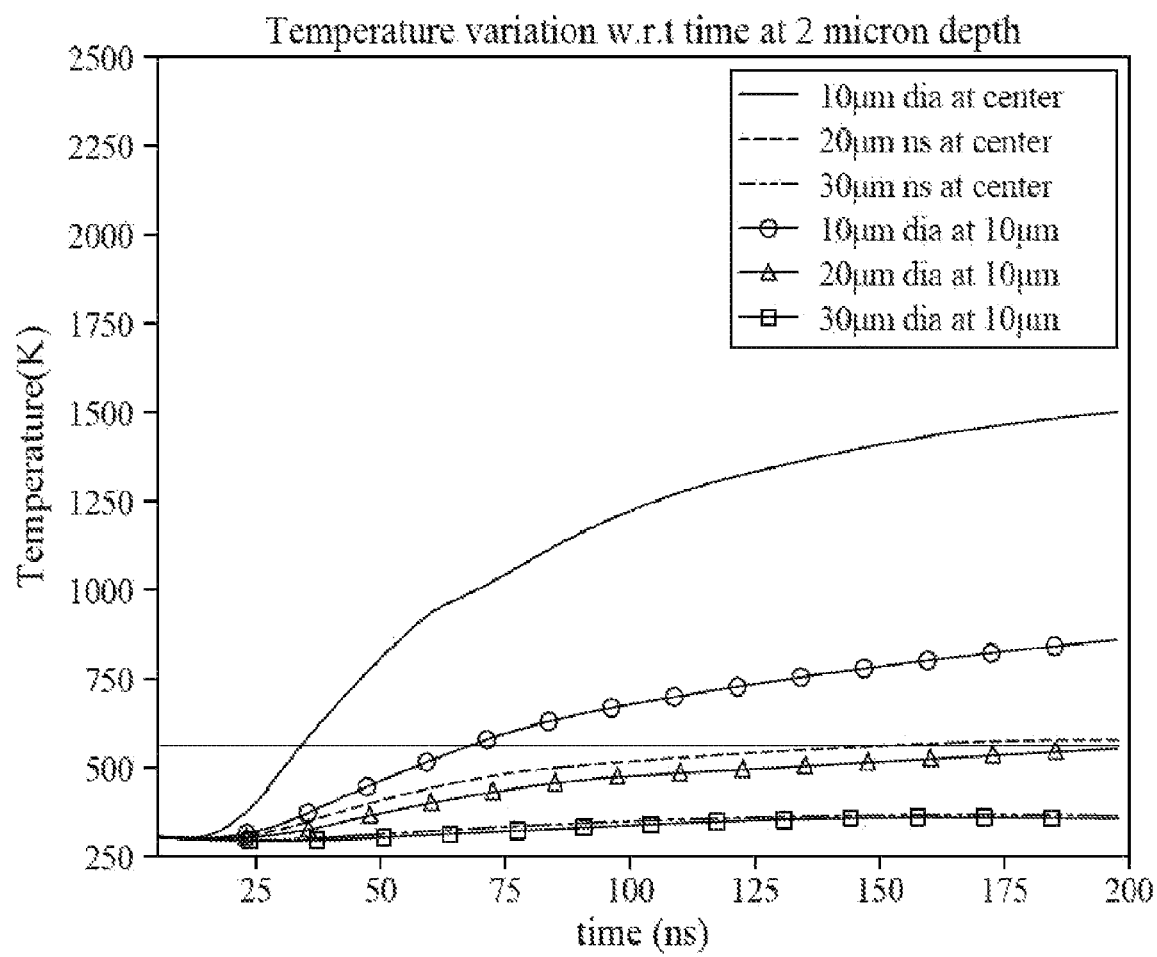
Figure 8:
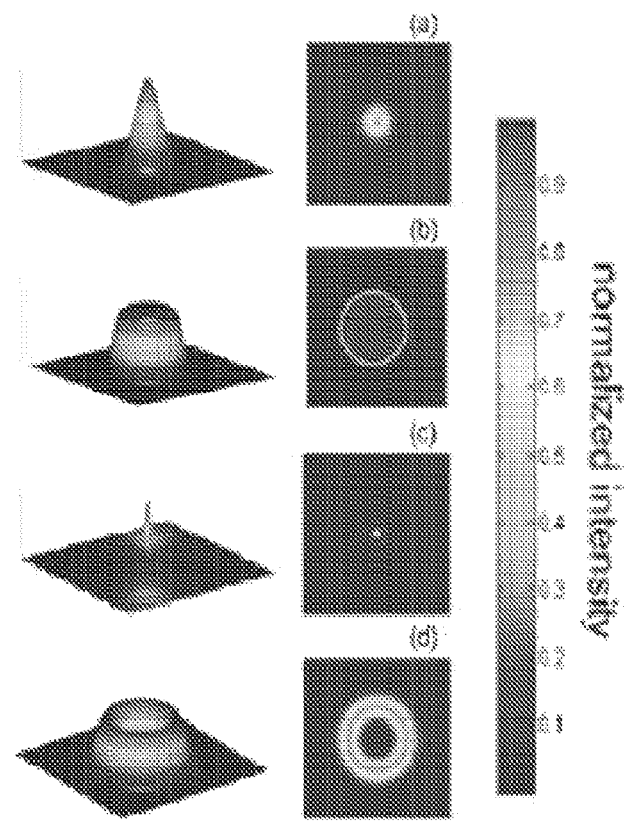
Figure 10:
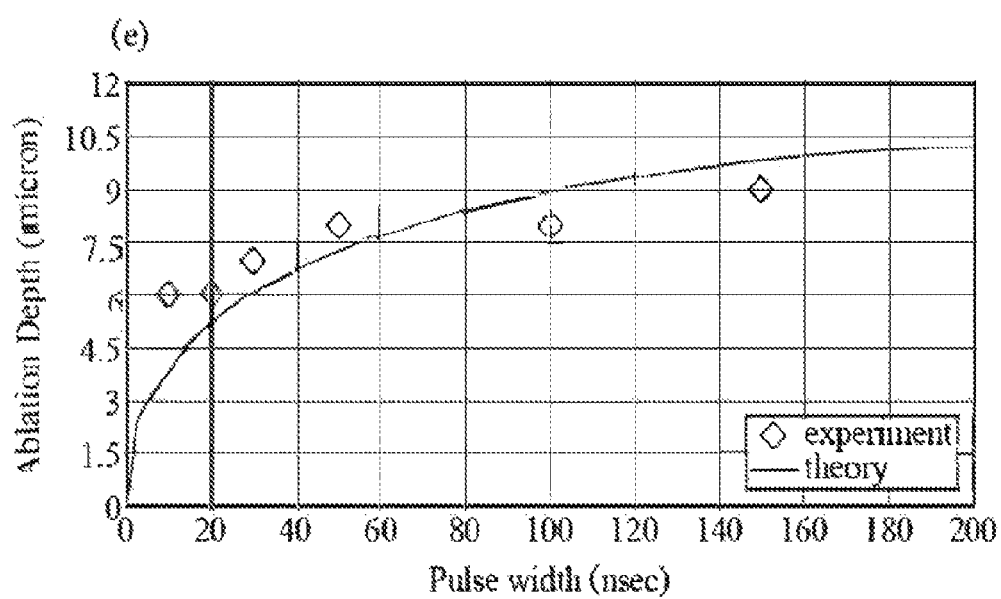
Figure 9:
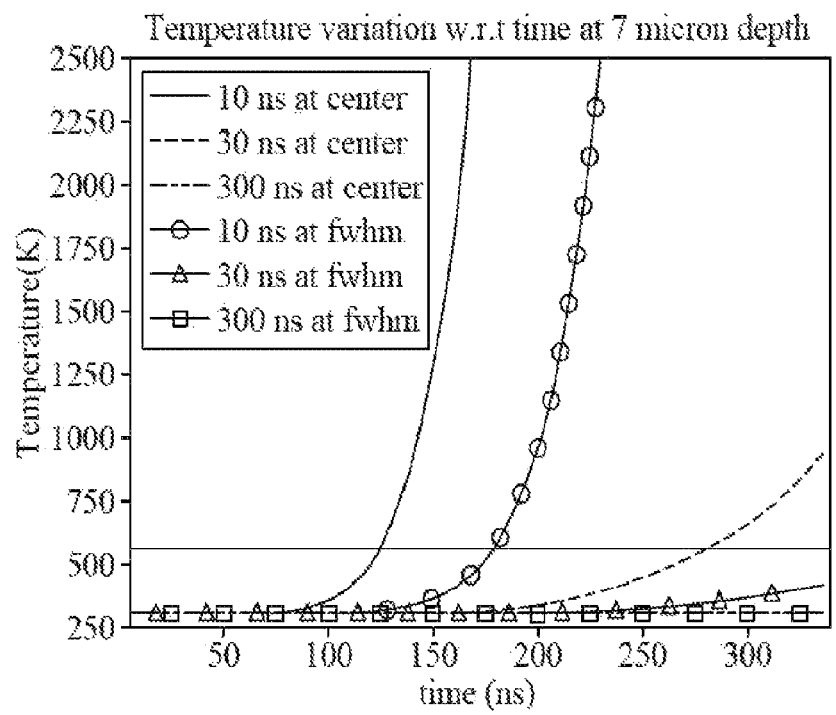
Figure 12:
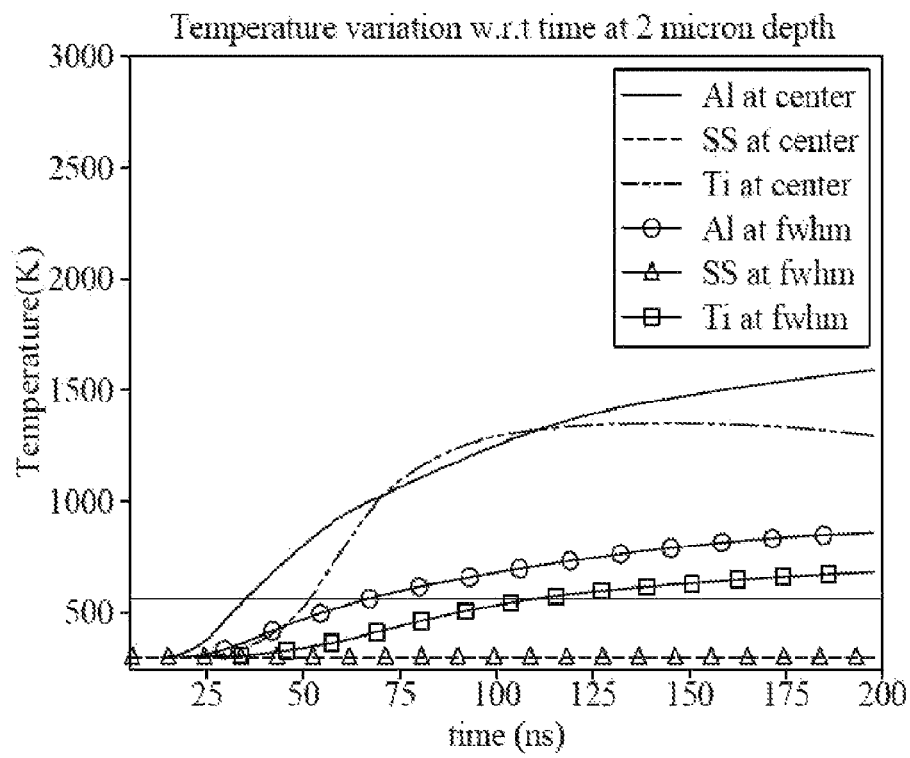
Figure 11:
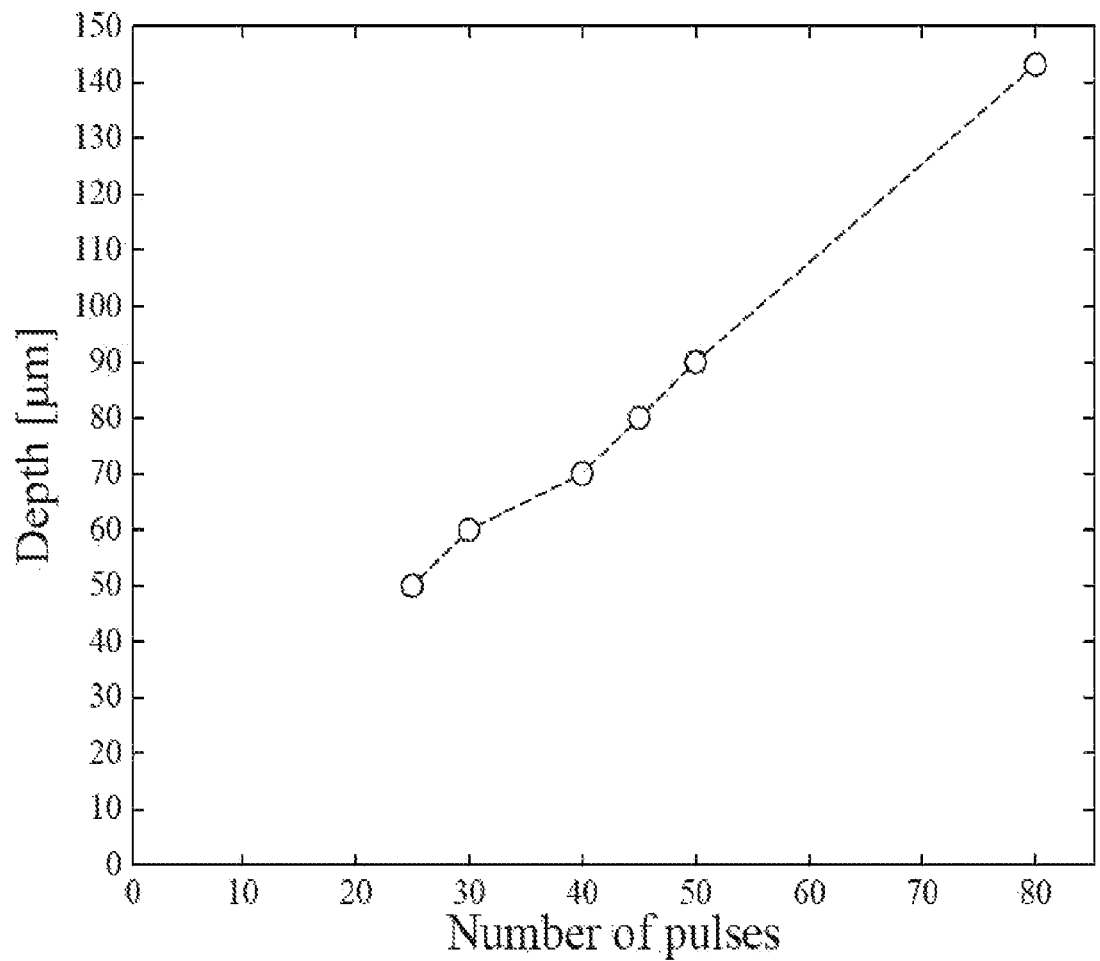
Figure 13:
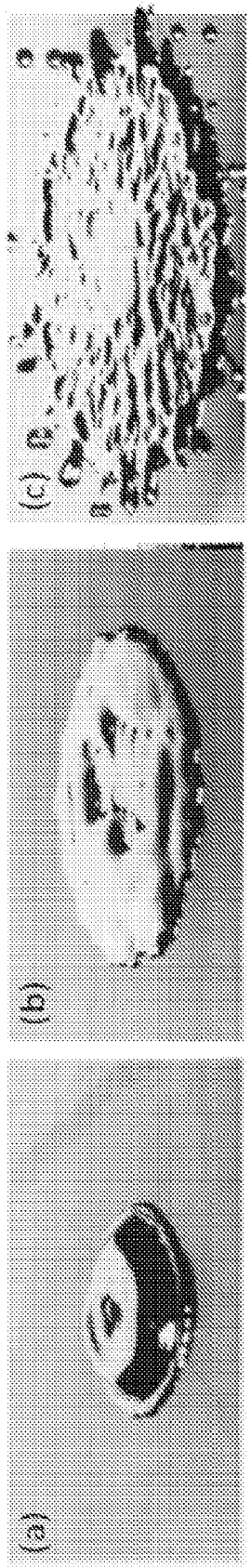
Figure 14A:
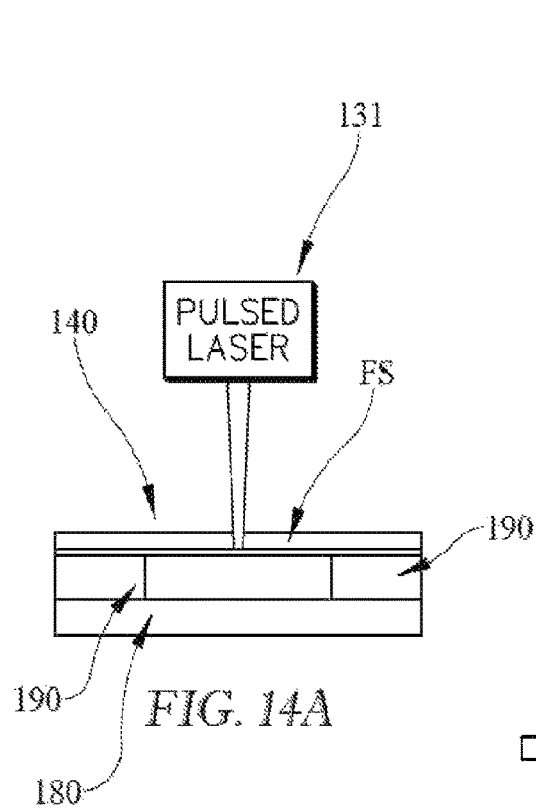
Figure 14B:
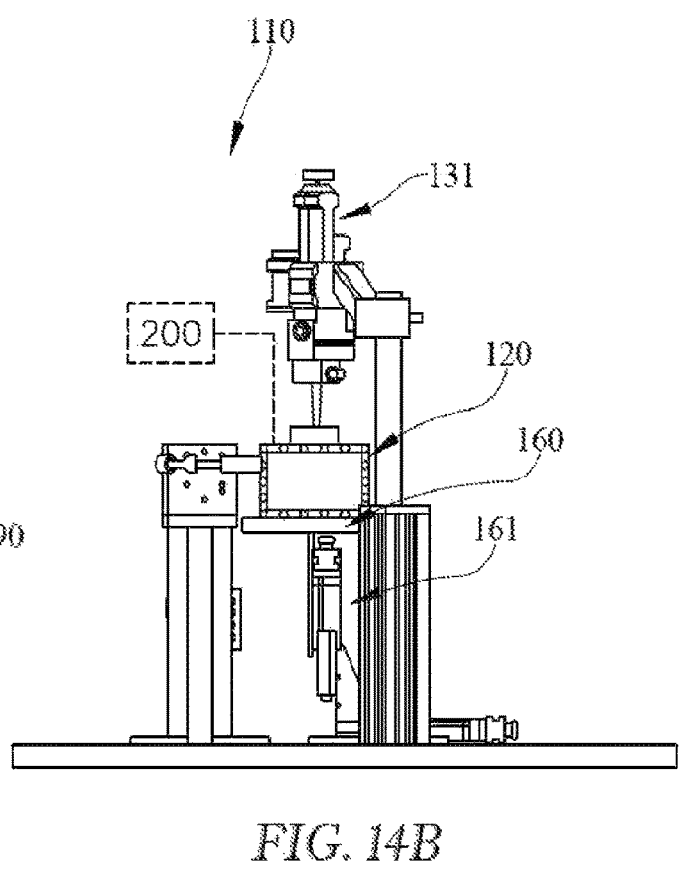
Figure 15:
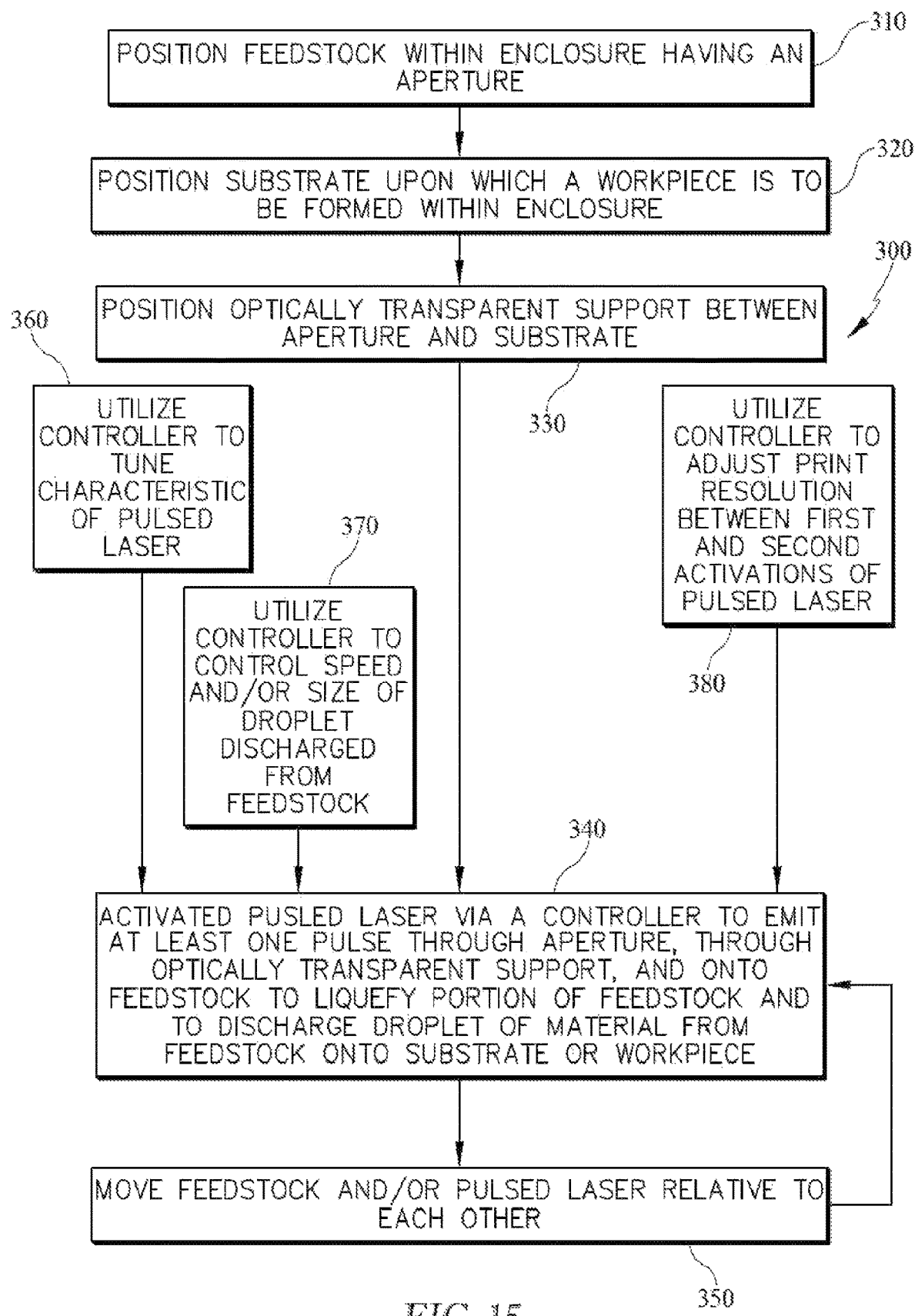
Figure 16:
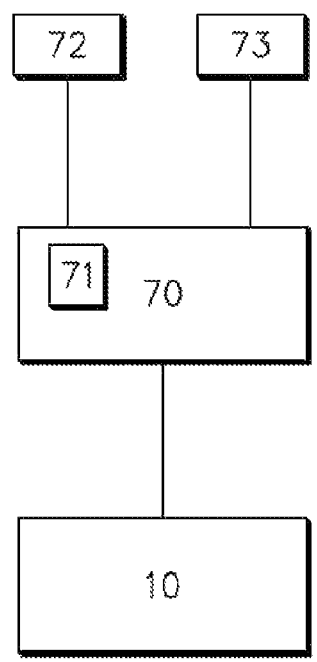

FIGS. 4(b)-4(e) are scanning electron microscopy images of metal droplets produced at different laser fluences according to systems and methods of the present disclosure;

FIG. 5 is a chart showing a comparison of shock wave and incident laser energy at different fluences for aluminum;

FIG. 6 illustrates temperature variation with respect to time at a feedstock depth of 4 μm according to example systems and methods of the present disclosure;

FIG. 7 illustrates the temperature distribution at a feedstock depth of 2 μm with respect to time for different laser beam pulse spot sizes according to example systems and methods of the present disclosure;

FIGS. 8(a)-8(d) illustrate a series of beam profiles and their normalized intensities;

FIG. 9 illustrates the temperature variation with respect to time in the feedstock at a depth of 7 μm for different pulse durations according to example systems and methods of the present disclosure;

FIG. 10 illustrates the relationship between feedstock ablation depth and pulse duration for aluminum;

FIG. 11 illustrates the ablation depths for steel utilizing a nanosecond pulsed laser with a laser fluence of 29 J/cm2;

FIG. 12 illustrates the temperature variation with respect to time at a feedstock depth of 2 μm for aluminum, stainless steel, and titanium according to example systems and methods of the present disclosure;

FIG. 13 shows a series of perspective views of droplets impacting a substrate at various velocities;

FIG. 14A is a diagrammatic setup of another example additive manufacturing system and example process of the present disclosure;

FIG. 14B is a side elevation view of the example additive manufacturing process setup shown in FIG. 13A;

FIG. 15 is a flowchart illustrating certain exemplary methods according to examples of the present disclosure; and FIG. 16 is a schematic representation illustrating a controller that is a component of the additive manufacturing system of FIG. 2 operatively coupled to the additive manufacturing system of FIG. 2 and certain of its other components.

DETAILED DESCRIPTION

AM systems and methods in accordance with at least some aspects of the present disclosure utilize metal feedstock and employ a drop-on-demand technique to facilitate production at the microscale level while achieving improved build rates. Specifically, methods of the present disclosure use the energy from a pulsed laser beam to eject metallic droplets from metal feedstock onto a substrate to construct a part in a layer-by-layer manner. Systems and methods of the present disclosure allow on-the-fly adjustment of process parameters, which permits tuning of the droplet features and better control over the printed part.

FIG. 2 illustrates an example AM system 10 according to at least some aspects of the present concepts. As shown in FIG. 2, system 10 generally includes an example enclosure 20, an example laser 30, an example support 40, an example feedstock advancement device 50, an example stage 60, an example controller 70, and an example substrate 80.

In the embodiment shown in FIG. 2, enclosure 20 includes an example base 21, an example top 22 having an example aperture or opening 23 therein, a first an example sidewall 24 having an example inlet 25, a second example sidewall 26 having an example outlet 27, an example third side wall 28, and an example fourth sidewall 29. First sidewall 24 and third side wall 28 are shown as transparent in FIG. 2 so that other components of system 10 are visible. Inert gas or other gasses can be directed through inlet 25 into enclosure 20. An inert gas environment may be desirable to prevent oxidation of the metal. Fumes generated during the AM process and other gasses can be removed from enclosure 20 through outlet 27.

Laser 30 in the embodiment shown includes an example laser pulse generator 31 connected to an example laser head 32 by an example optical fiber 33. Laser head 32 is provided with one or more scanning mirrors 34 for directing laser pulses to the desired location as discussed below. Laser head 32 is positioned outside of enclosure 20 and adjacent opening 23 in top 22. Laser head 32 directs laser pulses through opening 23 and into enclosure 20 as described in greater detail below. In certain embodiments, laser 30 is a nanosecond-pulsed laser, however, femtosecond-pulsed lasers and picosecond-pulsed lasers are also suitable for use with systems and methods of the present disclosure. One suitable laser that may be used with systems of the present disclosure is a IPG YLPN-1-20×500 Ytterbium based laser at a working wavelength of 1064 nm. In at least certain AM systems of the present disclosure, an example laser 30 has a power density or laser fluence between about 0.001-100 J/cm2.

Support 40 is an optically transparent plate or similar member. In the embodiment shown, support 40 is fixed within enclosure 20 by two example arms 41 that are connected at one end to fourth sidewall 29 and at the opposite end to support 40. Support 40 is positioned beneath opening 23 and laser head 32 such that the laser pulses are directed through support 40.

Feedstock advancement device 50, in the embodiment shown, is located at least partially within enclosure 20 and includes a plurality of example rollers 51. Feedstock advancement device 50 is used to advance the feedstock FS (such as a metal sheet or ribbon) within enclosure 20 and to maintain the feedstock in contact with the underside of support 40.

Stage 60 is positioned on or adjacent to base 22 of enclosure 20. In certain embodiments, stage 60 is moveable in the x, y and z directions relative to base 20. Stage 60 supports substrate 80 on which a workpiece WP is built via methods of the present disclosure.

Controller 70 (FIGS. 2 and 16) is utilized to operate laser 30, to control feedstock advancement device 50, and/or to control stage 60. Controller 70, in the exemplary embodiment shown in FIG. 2, includes memory system 71, input/output system 72, and display 73. Controller 70 is operatively connected to laser 30, actuators (not shown) for feedstock advancement device 50, and actuators (not shown)

for stage 60. Commands can be made to input/output system 72 (such, for example, via display 73 or other means), and input/output system 72 can deliver commands to the other components of AM system 10. Display 73 can provide information about the status, condition, or operation of AM system 10. With respect to laser 30, controller 70 activates laser 30 to cause laser 30 to emit one or more pulses through opening 23 in enclosure 20, through support 40, and onto feedstock FS at the desired location. Controller 70 can be used to control the number of laser pulses, the intensity of the laser pulses, the duration of the laser pulses, the time between pulses, the shape of the laser pulses, and other characteristics of operation of laser 30.

System 10 can be utilized to perform AM methods according to the present disclosure. In one such method, feedstock FS, such as a metal sheet, is kept in contact with support 40 by stretching it between rollers 51 of feedstock advancement device 50. Controller is utilized to cause laser 30 to emit a laser pulse through opening 23 in enclosure 20, through support 40, and onto feedstock FS. As the surface of feedstock FS heats up as a result of the laser pulse, a portion of feedstock FS undergoes a phase transformation from solid to liquid and eventually to vapor. The vapors formed at the surface of feedstock FS rapidly expand away from the surface, resulting in the formation of a pressure wave. With the help of support 40, the pressure wave is redirected towards feedstock FS, a portion of which is now in a molten state. The redirected pressure wave drives the molten metal from the underside of feedstock FS in the form of a droplet D. As droplet D moves through enclosure 20 toward substrate 60, it cools down and solidifies after striking substrate 60. In some examples, a Galvo system operated by controller 70 is utilized to raster the laser according to a predetermined pattern to repeat the process and deposit metal droplets where desired. The subsequent droplets strike the substrate and/or previously deposited droplets to build workpiece WP in a drop-by-drop and layer-by-layer manner. Rollers 51 of feedstock advancement device 50 can be actuated by controller 70 to position a fresh surface of feedstock FS beneath and in contact with support 40. In some aspects of the present concepts, a continuous feedstock feed system can be used to reduce production times.

Figure 3:
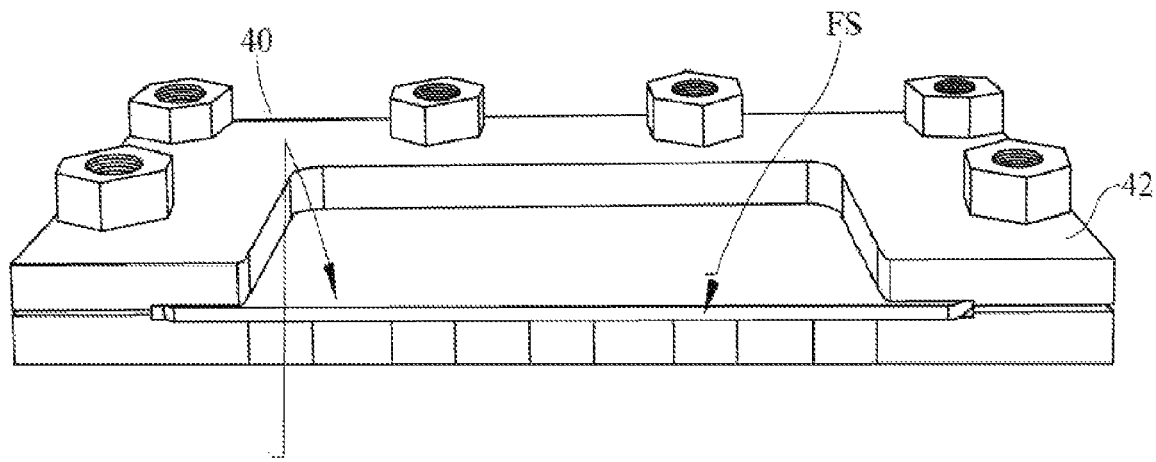
FIG. 3 is a perspective view of an example support that is a component of an example additive manufacturing system of the present disclosure.
Figure 4:
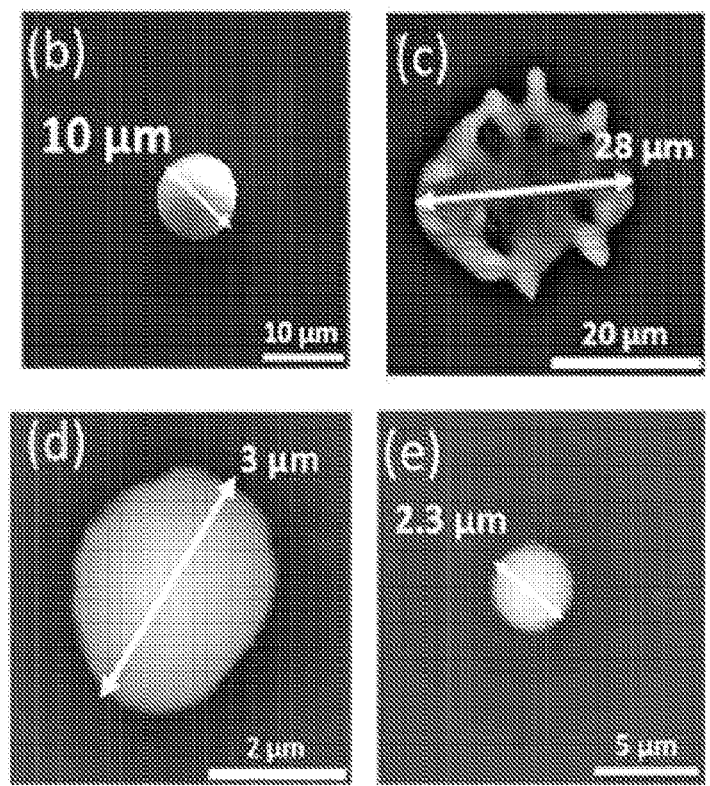

In one embodiment of an AM method according to at least some aspects of the present concepts, AM processes were carried out using an Ytterbium pulsed fiber laser (1064 nm wavelength) and commercially available 0.8 µm aluminum sheets as feedstock to eject droplets onto a clean Si wafer which acts as the substrate. Optical fiber 33 carries the photons from laser pulse generator 31 to laser head 32, which then focuses the laser at the desired height. The aluminum feedstock sheet FS was secured in a holder (FIG. 3) which sandwiches feedstock FS between a quartz support 40 and an aluminum plate 42 to ensure tight contact between feedstock FS and quartz support 40, which is necessary to confine and redirect the pressure wave. Scanning electron microscopy imaging was used to confirm the presence of aluminum droplets on the Si substrate. At low laser fluence (1.4 J/cm$^2$), a single spherical droplet of approximately 10 µm diameter (FIG. 4*b*) was observed indicating the droplet generation regime. At higher laser fluences (2.8 J/cm$^2$), a splatter of multiple droplets of smaller diameter (2.3-2.5 µm) was observed (FIGS. 4*d* and 4*e*), instead of a larger single droplet, which shows the dependence of the ejection regimes on laser fluence. Furthermore, changing the feedstock thickness to 8 µm, resulted in the formation of non-spherical droplets of larger size (28 µm) (FIG. 4*c*).

The droplet properties are affected by the process parameters, such as laser power, pulse duration, spot size, pulse frequency, feedstock thickness, distance between the feedstock and the substrate, and the feedstock material. Since droplet ejection is a transient, multiphase, multi-physics process, the inventors can simulate this process in two coupled parts. In part 1, the heat transfer equation was used to obtain the temperature distribution as well as the pressure generated over the simulated domain when the pulsed laser interacts with the metal surface of the feedstock. In part 2, these pressure and temperature values can be used to simulate the dynamics of the droplet ejection and calculate droplet properties such as ejection speed and droplet temperature.

The first part of the simulation involves using a finite difference method to solve the transient heat transfer equation in 2-dimensions:

$$\frac{\partial^2 T}{\partial x^2} + \frac{\partial^2 T}{\partial y^2} = \frac{\rho C_p}{k} \frac{\partial T}{\partial t}$$

Where T is the temperature, p is the temperature dependent density, $C_p$ is temperature dependent specific heat capacity and k is the temperature dependent conductivity. The above equation has been discretized using a finite difference method with the forward time centered space (FTCS) method. A Gaussian nanosecond pulse was simulated such that the incident energy from the pulse gets directly converted to heat and it is applied to the computational domain as the surface boundary condition. The domain sizes, pulse duration, spot sizes, laser power and feedstock materials were chosen accordingly. The numerical simulations iterate through time and provide the temperature distribution throughout the domain. The pressure generated through vaporization was estimated from the ideal gas law using the number of elements which have reached the vaporization temperature. The simulation results studying the laser intensity or fluence, spot size, pulse duration, and feedstock material are discussed below, along with other factors affecting methods according to the present disclosure.

Laser Fluence

Laser fluence (i.e., the optical energy delivered by the laser beam per unit area) determines the highest temperature that the metal feedstock surface will reach, which in turn dictates the energy of the emitted pressure wave, which is the driving force for droplet ejection. Below threshold fluence, increasing the laser fluence gradually increases the energy of the pressure wave. Increasing fluence beyond the threshold value may result in a sudden increase in the pressure wave energy, as shown in FIG. 5 (C. Porneala, D. A. Willis, Time-resolved dynamics of nanosecond laser-induced phase explosion, (2009). https://doi.org/10.1088/0022-3727/42/15/155503). Further increase may increase the pressure wave energy further, however, the rate of increase may be more gradual.

Controlling the laser fluence may therefore be used to control the speed and size of the ejected metal droplets. FIG. 6 illustrates the temperature distribution as a function of time at a depth of 4 µm for the simulations carried out. The temperature at two locations, under the laser beam center (solid lines) and at the point of full width at half maxima (dashed lines), is plotted. Also, plotted is the temperature equivalent to 0.6 times the melting temperature (T m), which is a rough guideline for the temperature at which the metal feedstock softens (i.e., loses most of its mechanical strength). In certain embodiments of the present concepts, laser fluence and other factors discussed herein are controlled to produce a temperature of about $0.4\, T_m$ to about $0.7\, T_m$ at a depth within the feedstock sufficient for a metal droplet to be ejected from the feedstock. In certain embodiments of the present concepts, the temperature is less than the melting temperature. From FIG. 6, it can be observed that at low laser intensity (5e12 W/m$^2$) the temperature at a depth of 4 μm is lower than $0.6\, T_m$, signifying that this particular laser intensity would be insufficient to cause droplet ejection from 4 μm thick feedstock. However, at a higher laser intensity (5e13 W/m$^2$) droplet ejection can take place from just under the center of the beam, but the energy is not sufficient for ejection at the distance of half maxima. Further increasing the laser intensity (5e14 W/m$^2$) enables the ejection even at the half maxima distance.

Laser Spot Size

The size of the laser spot may also be used to affect or tailor the ejected droplet properties. The print resolution of the workpiece, which may be determined based on the localized complexity of the workpiece, can be tuned by employing the dynamic focus feature of laser 30 to change the laser beam spot size. By changing the laser beam spot size, the effects of different beam sizes on the characteristics of the ejected droplet may be determined and applied to AM systems and methods of the present disclosure to obtain a desired droplet size and/or shape. In one example of the present concepts, the dynamic focus feature of laser 30 works by offsetting the focal plane away from surface of feedstock FS to modify the laser spot size. One factor in achieving high deposition rates is the ability to tune the droplet size on demand by simply changing the spatial resolution of the incident laser beam. The effect of different laser spot sizes on the temperature distribution over the domain was studied by simulating laser spots of radius 10, 20 and 30 μm. The total incident energy was kept constant for all three spot sizes. The temperature distribution at a depth of 2 μm for all three cases near the center and at a distance of 10 μm from the laser center is plotted in FIG. 7. It can be clearly observed that the wide spot leads to a higher temperature when compared to 20 and 30 μm wide spot sizes. The temperature values further decrease as spot size increases. Unlike the 30 μm wide spot, the and 20 μm wide pulses would generate enough energy to reach the softening temperature of about $0.6\, T_m$ both at the center and at a distance of 10 μm away from the center. In order to enable ejection with a 30 μm wide laser pulse, the intensity of the laser needs to increase to a value which increases the temperature of the feedstock above the softening temperature about $0.6\, T_m$. However, there exists a tradeoff between the pulse width and ejection volume. Reducing the spot size reduces the spatial distribution of the energy, which in turn would result in smaller volumes available for ejection, thereby affecting the droplet size. The spot size is also limited by the physical optical instruments used to focus the laser beam. In at least certain systems and methods of the present disclosure, spot sizes range from about 1 μm to about 1000 μm.

Laser Spot Shape

By changing the laser beam profiles with the help of one or more beam shaper attachments, the effects of different beam shapes on the characteristics of the ejected droplet may be determined and applied to AM systems and methods of the present disclosure. Changing the shape of the laser spot will change the localized heat distribution of the feedstock to control the volume of the ejected droplet. The droplet volume directly correlates to print resolution, facilitating the modulation of print resolution on-the-fly. In some aspects, AM systems of the present disclosure include localized resolution control to reduce production times by varying the print resolution based on the localized complexity of different regions of the manufactured part. In some examples, the shape of the laser beam spot may advantageously control or affect the spatial distribution of the energy of laser 30 on feedstock FS. For instance, different beam profiles such as, but not limited to, Gaussian (e.g., a comparatively higher concentration of focused light, etc.), top-hat or flat top (e.g., allowing for a comparatively uniform distribution of energy across a given area, etc.), annular, and Bessel beam (FIGS. 8a-8d; M. Chaja, T. Kramer, H. Neuenschwander, Influence of laser spot size and shape on ablation efficiency using ultrashort pulse laser system, in: Procedia CIRP, Elsevier B. V., 2018: pp. 300-304. https://doi.org/10.1016/j.procir.2018.08.119), distribute energy differently over the spatial domain and may result in different regions under the beam having different temperatures. This spot shape dependent localized temperature distribution may affect material removal rates, which in turn could alter the melt volume and correspondingly, change the size of the ejected droplets.

Laser Pulse Duration and Number of Pulses

The duration of the laser pulse affects the temporal distribution of the energy under the laser spot. Pulse durations in the range of about 1 ns to about 500 ns were simulated. Specifically, 10, 30 and 300 ns pulse durations with a 10 μm spot size were simulated and the temperature distribution at a depth of 7 μm is plotted in FIG. 9. The total incident energy was kept constant in all three cases to enable direct comparison. From FIG. 9, it can be observed that the temperature values increase as the pulse duration is reduced. This is a consequence of the higher power density when the pulse duration is reduced. The 10 ns pulse creates a large enough temperature rise to soften the feedstock both near the center of the laser spot and at the distance of half maxima, whereas the 30 ns pulse will not result in ejection at the half maxima distance. The 300 ns pulse, at this particular energy, will not increase the temperature above $0.6\, T_m$ at any point throughout the domain.

FIG. 10 (M. Chaja, T. Kramer, H. Neuenschwander, Influence of laser spot size and shape on ablation efficiency using ultrashort pulse laser system, in: Procedia CIRP, Elsevier B. V., 2018: pp. 300-304. http://doi.org/10.1016/j.procir.2018.08.119) illustrates the relationship between feedstock ablation depth and pulse duration for aluminum. The ablation depth under the laser pulse strongly affects the temperature distribution and can be correlated to the properties of the ejected droplet. It can be seen that initial increase in the pulse duration rapidly increases the ablation depth, and as the pulse duration reaches about 200 ns, the ablation depth saturates.

Ablation efficiency may also change with the number of laser pulses. For example, as shown in FIG. 11, the ablation depths for steel utilizing a nanosecond pulsed laser (laser fluence 29 J/cm2) increased rapidly from 50 to 90 μm as the number of incident pulses changed from 25 to 50.

Feedstock Material

The feedstock material also affects the temperature distribution. Temperature varying material specific properties such as the density, specific heat capacity, and conductivity for aluminum (Al), stainless steel (SS) and titanium (Ti) were incorporated into the theoretical model to obtain the temperature distribution for each material. Keeping all other parameters constant, it can be seen that the temperature distribution varies for all three materials. The temperature distributions for the above-mentioned materials at a depth of 24 µm is plotted in FIG. 12. At the depth of 24 µm, both Al and Ti have reached the softening temperature near the center as well as at a distance of half maxima intensity. However, the temperature change in case of SS feedstock is not enough for droplet ejection.

For a given feedstock material, other characteristics of the particular feedstock sheet, such as thickness and surface finish, also affect droplet ejection, size and shape. For example, the feedstock sheet must be thick enough to have sufficient structural integrity to be held and moved by feedstock advancement device 50. However, as feedstock sheet thickness increases, it becomes more difficult to reach the desired temperature of about 0.4 $T_m$ to 0.7 $T_m$ at a sufficient depth within the feedstock sheet to eject a metal droplet. Also, the higher the reflectivity of the feedstock sheet, the more likely the feedstock will reflect energy from the incident laser away from the feedstock, thereby making it more difficult to achieve the desired temperature at the desired depth.

Substrate Interaction and Distance

The ejected metal droplets interact with the substrate upon making contact with the substrate. The interaction between the droplet and the substrate can also affect the shape and/or size of the features printed. The interaction of the droplet with the substrate may be generally divided into two different regimes: (1) droplet impact and spreading, and (2) droplet solidification. When an ejected droplet with high velocity strikes the stationary substrate, the droplet deforms and spreads onto the substrate into a shape of a flattened disk. This impact driven spread is followed by recoil and subsequent oscillations between spreading and recoil. The viscous forces of the liquid droplet eventually dampen these oscillations. As these oscillations take place, the molten droplet starts to transfer its heat to the relatively cooler substrate and starts to solidify. The initial velocity of the ejected droplet may directly affect the final shape and size of the solidified droplet. Higher velocities of the ejected droplets may create a larger splatter diameter, and the splatter diameter may decrease with a corresponding decrease in droplet velocity, as shown in FIGS. 13(a)-13(c), where FIG. 13(a) illustrates droplet impact at 1 m/s, FIG. 13(b) illustrates impact at 2 m/s, and FIG. 13(c) illustrates impact at 4 m/s for tin droplets impacting a 250° C. stainless steel substrate. (S. D. Aziz, S. Chandra, Impact, recoil and splashing of molten metal droplets, Int. J. Heat Mass Transf. 43 (2000) 2841-2857. http://doi.org/10.1016/S0017-9310(99)00350-6.) The distance between the feedstock and the substrate can also affect the size and shape of the solidified droplet. The greater the distance between the feedstock and the substrate, the greater the amount the metal droplet will cool prior to contacting the substrate. In certain embodiments of the present concepts, the distance between the lower surface of the feedstock and the upper surface of the substrate can be selected to range from about 100 microns to about 1 m.

The directionality of the droplets as they travel toward and make impact with the substrate also affects the resulting feature printed. In order to precisely deposit the ejected droplet in the desired location, it is preferred that the droplet travels straight down following the direction of the laser pulse. The directionality of the falling droplets can be controlled by introducing an external field, such as magnetic/electric field and inducing, for example, a charge onto the metal droplets. This will allow control of the speed as well the direction of the ejected droplets. Accordingly, in at least some aspects of the present concepts, an AM system includes an electric field generator to apply an electric field to the ejected droplet at some point during its movement, such as during travel of the droplet between the feedstock and the substrate. In some examples, the electric field generator applies a voltage through electrodes connected to the feedstock and to the substrate. In at least some examples, the AM system includes a magnetic field generator to apply a magnetic field to the ejected droplet at some point during its movement, such as during travel of the droplet between the feedstock and the substrate. In some examples, the magnetic field generator includes a metal coil within which a pulsing electric current is passed to produce a time-varying magnetic field. The magnetic field generator and/or electric field generator can be operatively connected to and controlled via controller 70.

Other characteristics of the substrate, such as surface roughness and temperature, can also be advantageously selected to affect the size and shape of the solidified droplet. Generally speaking, the rougher the substrate surface, the better the bonding between the substrate surface and the droplet through mechanical interaction. A temperature of the substrate can also be advantageously selected to affect the size and/or shape of the solidified droplet, with a lower substrate temperature causing a more rapid solidification of a metal droplet than would a comparatively higher substrate temperature.

FIG. 14 illustrates an example AM system 110 according to another aspect of the present concepts. FIG. 14A illustrates an example support 140 (e.g., a glass slide, etc.) spaced apart from an example substrate 180 (e.g., a polished steel plate, etc.) by spacers 190. Feedstock FS may be placed in tight contact with support 140 between spacers 190 and support 140. Spacers 190 can be selected to maintain the desired space between feedstock FS and substrate 180. In some examples, this entire assembly is placed in a sealed enclosure 120 in an inert gas environment. In some examples, sealed enclosure 120 is mounted on top of an example motorized stage 160 whose motion can be controlled in the x, y and z directions by an example actuator system 161. By moving stage 160 in the x- and y-directions, different regions of feedstock FS can be positioned under laser head 131. In some examples, a high-speed camera 200 or other imaging device is included within the sealed enclosure, or outside of the sealed enclosure, with a field of view enabling imaging of one or more characteristics of the ejected droplets (e.g., the size and/or speed of the ejected droplets, etc.) to ensure the proper characteristic(s) (e.g., size and/or speed) of the ejected droplets is achieved. Such a camera 200 can also optionally be utilized with AM system 10 described above. Camera 200 can be operatively connected to and operated via controller 70.

As discussed above, AM processes and systems in accord with the present concepts utilize metal feedstock and provide tunable print resolution by selecting various process parameters from amongst a plurality of available selectable process parameters to control metal droplet size, shape, cooling rate, and deposition location. Droplet characteristics can be controlled by systematically varying one or more of the process parameters such as, but not limited to, laser fluence, laser beam spot size, laser beam shape, laser pulse duration, and/or laser beam pulse frequency. Varying one or more of these parameters provides on-the-fly tunability of the droplets and the resulting printed features, and provides higher resolution, reduces the minimum distance between printed features, and produces higher build rates than existing technologies, including existing processes that utilize powder feedstock. Methods and systems in accord with one or more aspects of the present concepts can facilitate manufacturing at the microscale level in industries such as aerospace, automotive, and biomedical.

FIG. 15 illustrates certain exemplary methods according to aspects of the present concepts. In certain examples, an additive manufacturing method 300 includes positioning a feedstock comprising a sheet or ribbon of material within an enclosure, the enclosure defining an inlet, an outlet, and an aperture (310). The method further includes positioning a substrate upon which a workpiece is to be formed within the enclosure (320) and positioning an optically transparent support having a surface over which the feedstock is movable between the aperture and the substrate (330). The method further includes activating a pulsed laser disposed outside the enclosure, via a controller, to emit one or more pulses through the aperture and into the enclosure, through the optically transparent support, and onto a selected portion of the feedstock to liquefy the selected portion of the feedstock and to discharge a droplet of the material from a portion of the feedstock onto the substrate or onto a workpiece on the substrate (340). The method further includes moving the feedstock and/or the pulsed laser relative to each other. (350). Certain methods of the present disclosure optionally include utilizing the controller to tune one or more characteristics of the pulsed laser, such as, for example, spot size, a focal plane of the pulsed laser relative to an upper surface of the feedstock, pulse shape, pulse frequency, pulse power density, and/or pulse width (360). Other methods of the present disclosure optionally include utilizing the controller to control the speed and/or a size of the droplet discharged from the feedstock (370). Other methods of the present disclosure optionally include utilizing the controller to adjust the print resolution between a first and second activations of the pulsed laser (380).

Although aspects of the present concepts have been shown and described in detail, the examples provided are for purposes of illustration only and are not to be interpreted as a limitation on the scope of the present concepts. Numerous modifications can be made to the systems and methods of the present disclosure without departing from the scope of the present concepts. For example, although systems and methods of the disclosure have been discussed primarily in connection with metal feedstock, the principles of the present concepts can be advantageously applied to other feedstock materials, such as semiconductor materials and ceramics. Similarly, although various example systems and methods have been described in connection with a nanosecond pulsed laser, other embodiments of the present concepts could alternatively utilize a femtosecond pulsed laser or a picosecond pulsed laser. The specific operating parameters of the laser, laser fluence, spot size, spot shape, and other variables discussed in the present disclosure can be other than as explicitly presented in the examples. Other variations are also within the scope of the present concepts.

What is claimed:

1. An additive manufacturing system, comprising:
    an enclosure, the enclosure defining an inlet, an exhaust, and an aperture and comprising a substrate upon which a workpiece is to be formed and an optically transparent support disposed between the aperture and the substrate;
    a pulsed laser, disposed outside the enclosure, positioned to emit one or more pulses through the aperture and into the enclosure;
    a feedstock comprising a sheet or ribbon of material that is moveable with respect to the transparent support;
    a feedstock advancement device, at least partially disposed within the enclosure, to advance the feedstock within the enclosure and to maintain the feedstock adjacent the optically transparent support; and
    a controller to cause the pulsed laser to emit one or more pulses through the aperture and the optically transparent support to impinge upon a selected portion of the feedstock to liquefy the selected portion of the feedstock and discharge a droplet of the material from the feedstock onto the substrate or onto a workpiece on the substrate.

2. The additive manufacturing system of claim 1, wherein the pulsed laser is controllable, via the controller, in an X-plane, a Y-plane and/or both the X-Y planes to raster the laser across the feedstock.

3. The additive manufacturing system of claim 2, further comprising at least one scanning mirror and wherein the pulsed laser is controllable, via the controller and at least one scanning mirror, in an X-plane, a Y-plane and/or both the X-Y planes to raster the laser across the feedstock.

4. The additive manufacturing system of claim 1, wherein the inlet is connected to a gas supply line delivering an inert gas, and wherein the exhaust is connected to an external environment to exhaust gas or fumes from the enclosure.

5. The additive manufacturing system of claim 1, wherein the sheet or ribbon of material comprises a metal, a metal alloy, a plastic, a polymer, a ceramic, a semiconducting material, or a composite of two or more materials.

6. The additive manufacturing system of claim 1, wherein the pulsed laser comprises a nanosecond (ns)-pulsed laser, a femtosecond (fs)-pulsed laser, or a picosecond (ps)-pulsed laser.

7. The additive manufacturing system of claim 1, wherein the controller is configured to cause the pulsed laser to emit one or more pulses having a duration that ranges from about 1 ns to about 500 ns.

8. The additive manufacturing system of claim 7, wherein the controller is configured to cause the pulsed laser to emit one or more pulses having a duration of at most 200 ns.

9. The additive manufacturing system of claim 8, wherein the controller is configured to cause the pulsed laser to emit one or more pulses having a duration of about 30 ns.

10. The additive manufacturing system of claim 1, wherein the pulsed laser has a power density or laser fluence between about 0.001 and about 100 J/cm2.

11. The additive manufacturing system of claim 1, wherein the controller is configured to cause the pulsed laser to emit one or more pulses that impinge upon the feedstock with a power density or laser fluence that ranges from about 0.001 J/cm2 to about 100 J/cm2.

12. The additive manufacturing system of claim 11, wherein the controller is configured to cause the pulsed laser to emit one or more pulses that impinge upon the feedstock with a power density or laser fluence that ranges from about 1.0 J/cm2 to about 30 J/cm2.

13. The additive manufacturing system of claim 12, wherein the controller is configured to cause the pulsed laser to emit one or more pulses that impinge upon the feedstock with a power density or laser fluence that ranges from about 1.4 J/cm2 to about 2.8 J/cm2.

14. The additive manufacturing system of claim 1, wherein the controller is configured to cause the pulsed laser to heat a portion of the feedstock to a temperature that ranges from about $0.4\,T_m$ to about $0.7\,T_m$ for the feedstock material.

15. The additive manufacturing system of claim 14, wherein the controller is configured to cause the pulsed laser to heat a portion of the feedstock to a temperature of about 0.6 $T_m$ for the feedstock material.

16. The additive manufacturing system of claim 1, wherein the controller is configured to adjust a print resolution of the workpiece on-the-fly between a first activation of the pulsed laser to emit one or more pulses onto a first selected portion of the feedstock and a second activation of the pulsed laser to emit one or more pulses onto a second selected portion of the feedstock.

17. The additive manufacturing system of claim 1, wherein the controller is configured to control the pulsed laser to adjust a print resolution of the workpiece on-the-fly by changing at least one of a pulse shape, a pulse duration, a pulse frequency, a pulse power density or laser fluence, a pulse beam size or pulse width, or a number of pulses between the first activation and the second activation.

18. The additive manufacturing system of claim 1, wherein the controller is configured to control a spot size of the one or more pulses by offsetting a focal plane of the pulsed laser relative to an upper surface of the feedstock.

19. The additive manufacturing system of claim 1, wherein the controller is configured to cause the pulsed laser to emit one or more pulses that impinge upon the feedstock with a laser beam spot size that ranges from about 1 μm to about 1000 μm.

20. The additive manufacturing system of claim 19, wherein the controller is configured to cause the pulsed laser to emit one or more pulses that impinge upon the feedstock with a laser beam spot size that ranges from about 10 μm to about 30 μm.

21. The additive manufacturing system of claim 20, wherein the controller is configured to cause the pulsed laser to emit one or more pulses that impinge upon the feedstock with a laser beam spot size of about 20 μm.

22. The additive manufacturing system of claim 1, wherein the droplet discharged from the feedstock is deposited onto the substrate or onto the workpiece on the substrate directly underneath the selected portion of the feedstock.

23. The additive manufacturing system of claim 1, wherein the substrate is movable.

24. The additive manufacturing system of claim 1, further comprising a moveable stage disposed within the enclosure, and wherein the substrate is positioned on the moveable stage.

25. The additive manufacturing system of claim 1, wherein the feedstock advancement device comprises one or more guide rollers.

26. The additive manufacturing system of claim 1, wherein the feedstock advancement device comprises a first set of guide rollers on a first side of the optically transparent support and a second set of guide rollers on a second side of the optically transparent support.

27. The additive manufacturing system of claim 1, wherein the controller is configured to advance the feedstock, via the feedstock advancement device, following the discharge of the droplet of the material from the feedstock.

28. The additive manufacturing system of claim 1, wherein the controller is configured to cause the pulsed laser to emit a plurality of pulses through the aperture and the optically transparent support to impinge upon a corresponding plurality of selected portions of the feedstock to liquefy the selected portions of the feedstock and discharge a corresponding plurality of droplets of the material from corresponding portions of the feedstock, each of the plurality of droplets being deposited onto the substrate or onto a workpiece on the substrate underneath the respective selected portions of the feedstock.

29. The additive manufacturing system of claim 1, wherein the controller is configured to advance the feedstock, via the feedstock advancement device, following the discharge of a plurality of droplets of the material from the feedstock from a plurality of selected portions of the feedstock.

30. The additive manufacturing system of claim 1, wherein droplet of the material is discharged from a bottom portion of the feedstock.

31. The additive manufacturing system of claim 1, wherein the thickness of the feedstock ranges from about 0.5 μm to about 100 μm.

32. The additive manufacturing system of claim 31, wherein the thickness of the feedstock ranges from about 4 μm to about 8 μm.

33. The additive manufacturing system of claim 1, wherein the distance between the feedstock to the substrate ranges from about 100 μm to about 1 m.

34. The additive manufacturing system of claim 1, further including means for applying an electric field to the droplet as it travels from the feedstock to the substrate.

35. The additive manufacturing system of claim 1, further including means for applying a magnetic field to the droplet as it travels from the feedstock to the substrate.

36. The additive manufacturing system of claim 1, wherein the location of the transparent support is fixed within the enclosure.

\* \* \* \* \*